United States Patent
Kim et al.

(10) Patent No.: US 8,681,898 B2
(45) Date of Patent: Mar. 25, 2014

(54) SIGNAL AMPLIFYING APPARATUS, WIRELESS TRANSMITTING APPARATUS, AND SIGNAL AMPLIFYING METHOD

(75) Inventors: Joon-Hyung Kim, Daejeon (KR); Sung-Jun Lee, Daejeon (KR); Jae-Ho Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 10 days.

(21) Appl. No.: 13/449,231

(22) Filed: Apr. 17, 2012

(65) Prior Publication Data

US 2012/0263257 A1 Oct. 18, 2012

(30) Foreign Application Priority Data

Apr. 18, 2011 (KR) .................. 10-2011-0035840

(51) Int. Cl.
*H03C 3/00* (2006.01)
(52) U.S. Cl.
USPC .......................................... 375/302; 375/297
(58) Field of Classification Search
None
See application file for complete search history.

(56) References Cited

U.S. PATENT DOCUMENTS

| 7,755,431 B2 | 7/2010 | Sun |
| 7,924,939 B2 | 4/2011 | Kim et al. |
| 7,944,994 B2 * | 5/2011 | Matsuura et al. ............. 375/302 |
| 2009/0180530 A1 * | 7/2009 | Ahn .............................. 375/238 |

FOREIGN PATENT DOCUMENTS

| KR | 1020090069143 A | 6/2009 |
| KR | 10-0978221 B1 | 8/2010 |

OTHER PUBLICATIONS

Woo-Young Kim et al., "1-bit and Multi-bit Envelope Delta-Sigma Modulators for CDMA Polar Transmitters", Asia-Pacific Conference Microwave, 2008, IEEE, Korea.

* cited by examiner

*Primary Examiner* — Leon-Viet Nguyen

(57) ABSTRACT

A signal amplifying apparatus, a wireless transmitting apparatus, and a signal amplifying method are provided. The signal amplifying apparatus modulates an envelope signal using a multi-bit quantizer, thereby increasing coding efficiency and tracking optimal supply voltage with respect to envelope variation due to the use of the multi-bit quantizer.

8 Claims, 5 Drawing Sheets

US 8,681,898 B2

SIGNAL AMPLIFYING APPARATUS, WIRELESS TRANSMITTING APPARATUS, AND SIGNAL AMPLIFYING METHOD

CROSS-REFERENCE TO RELATED APPLICATION(S)

This application claims the benefit under 35 U.S.C. §119 (a) of Korean Patent Application No. 10-2011-0035840, filed on Apr. 18, 2011, in the Korean Intellectual Property Office, the entire disclosure of which is incorporated herein by reference for all purposes.

BACKGROUND

1. Field

The following description relates to wireless communications, and more particularly, to signal amplification in a wireless transmitting apparatus.

2. Description of the Related Art

Recent wireless communication technology has achieved a high data transmission speed. Accordingly, the wireless communication technology has shifted from a code division multiple access-(CDMA-)based system to a system such as an orthogonal frequency division multiplexing (OFDM) that uses multiple sub-carrier modulation scheme. For example, systems, such as Worldwide Interoperability for Microwave Access (WiMAX), wireless broadband (WiBro), $3^{rd}$ generation long term evolution (3G LTE), and the like, uses an OFDM modulation scheme.

In such an OFDM system, the summation of sub-carriers causes increase of a peak to average power ratio (PAPR). Hence, various methods for increasing efficiency in a transmitting apparatus have been discussed. As one example, there is an envelope elimination and restoration (EER) method in which a phase signal is input to a power amplifying apparatus using polar coordinates, and envelope information is applied to a bias unit of the power amplifying apparatus.

SUMMARY

The following description relates to a high-efficiency signal amplification technique to increase coding efficiency of an amplifier and track optimal supply voltage with respect to envelope variation.

In one general aspect, there is provided a signal amplifying apparatus including: a signal modulating unit configured to quantize an envelope signal into multiple levels to output a multi-level quantized signal; a signal amplifying unit configured to amplify a pulse quantized signal that is obtained by transforming the multi-level quantized signal into a form of a pulse; and a bias generating unit configured to track changes in amplitude of the pulse quantized signal and to provide a bias to the signal amplifying unit based on a result of tracking.

In another general aspect, there is provided a wireless transmitting apparatus including: a polar coordinate transformation unit configured to transform an input signal into polar coordinates and output an envelope signal; a signal modulating unit configured to quantize the envelope signal into multiple levels to output a multi-level quantized signal; a signal amplifying unit configured to amplify a pulse quantized signal, which is obtained by transforming the multi-level quantized signal into a form of a pulse, and to output the amplified pulse quantized signal; a bias generating unit configured to track changes in amplitude of the pulse quantized signal and to provide a bias to the signal amplifying unit based on a result of tracking; and a transmitting unit configured to transmit the amplified pulse quantized signal output from the signal amplifying unit through an antenna.

In another general aspect, there is provided a method of amplifying a signal in a signal amplifying apparatus, the method including: quantizing an envelope signal into multiple levels to output a multi-level quantized signal; amplifying a pulse quantized signal that is obtained by transforming the multi-level quantized signal into a form of a pulse; and tracking changes in amplitude of the pulse quantized signal and providing a bias for amplifying the pulse quantized signal based on a result of tracking.

Other features and aspects may be apparent from the following detailed description, the drawings, and the claims.

Figure 1:
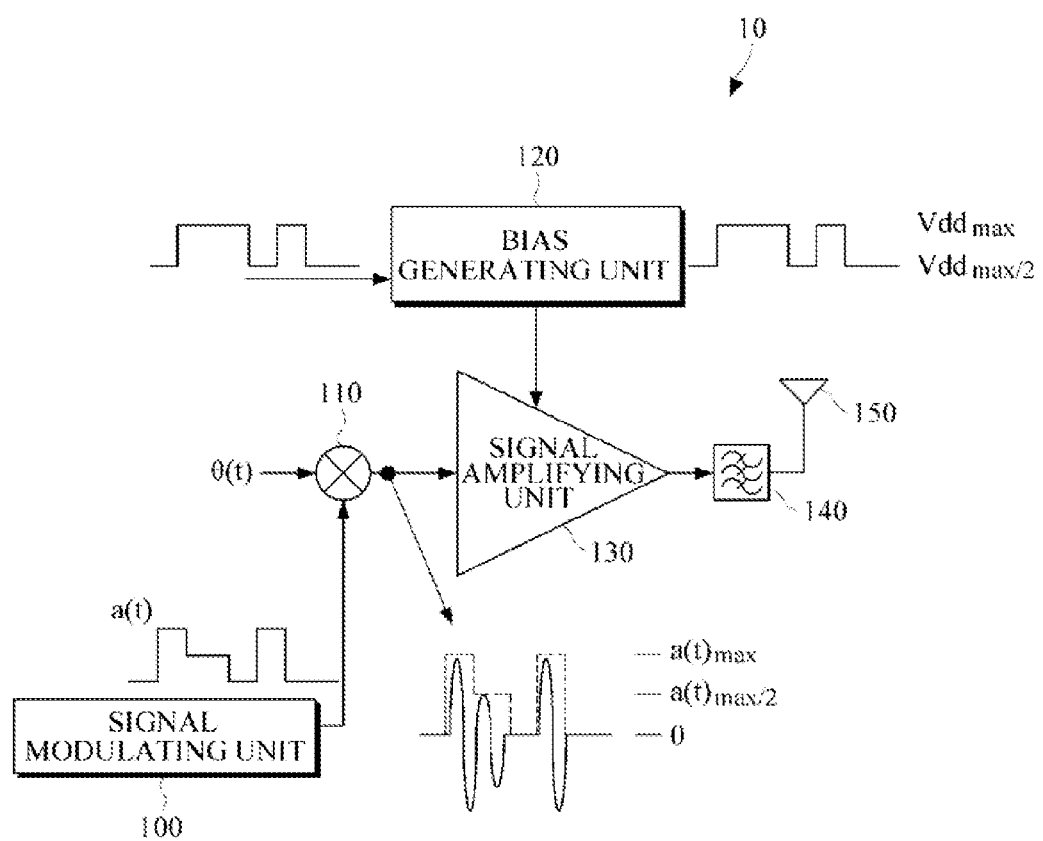
FIG. 1 is a diagram illustrating an example of a signal amplifying apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a diagram illustrating an example of a signal amplifying apparatus. Referring to FIG. 1, a signal amplifying apparatus 10 may include a signal modulating unit 100, a bias generating unit 120, and a signal amplifying unit 130.

The signal modulating unit 100 may quantize an envelope signal a(t) into multiple levels, and output a digitalized multi-level quantized signal. The envelope signal may be delta-sigma modulated.

In a case in which an envelope signal having non-constant properties is encoded to an envelope signal having constant properties by quantizing envelope information into 1 bit using delta-sigma modulation or pulse-width modulation, generally it is possible to maximize an efficiency of a signal amplifying apparatus because the signal amplifying apparatus always operates within a saturation region. However, the use of the above-described 1-bit encoding method may cause coding efficiency degradation.

The coding efficiency is represented by the sum of a noise and a desired signal, the noise being generated when envelope information is quantized into 1 bit, that is, a ratio of a power of the desired signal to a total power. In the case of using a general delta-sigma modulation scheme, a time variation envelope is quantized into a 1-bit pulse signal, and thus quantization noise is generated. In this case, the signal amplifying apparatus must consume direct current (DC) power to amplify undesired noise power, and hence a final efficiency of the signal amplifying apparatus is reduced.

However, the signal modulating unit 100 quantizes envelope information into multiple bits (k bits wherein K≥2). In specific, the signal modulating unit 100 outputs a signal in the form of a pulse having a multi-bit sequence by digitizing envelope information, which is output from a polar coordinate transformation unit (not shown). The signal modulating unit 100 may be a multi level-envelope delta sigma modulator (hereinafter, referred to as a "ML-EDSM"). In use of the ML-EDSM, coding efficiency increases with the increase of the number of levels, and it will be described later with reference to FIG. 2.

The signal amplifying unit 130 may amplify a pulse quantized signal that is obtained by combining a multi-level quantized signal and a phase signal ($\theta(t)$). A combining unit may combine the multi-level quantized signal and the phase signal to generate the pulse quantized signal.

The bias generating unit 120 may be a high efficiency dual bias generator (DBG) to track changes in amplitude of the pulse quantized signal input to the signal amplifying unit 130 and to provide a bias to the signal amplifying unit 130 based on a result of tracking.

When the signal amplifying unit 130 receives pulses having different magnitudes and the bias generating unit 120 applies a fixed bias to the signal amplifying unit 130, amplification efficiency of the signal amplifying apparatus 10 may be reduced. To overcome such drawbacks, the bias generating unit 120 may use a dynamic method by which a relatively low bias is applied with respect to a pulse having a smaller magnitude and a relatively large bias is applied with respect to a pulse having a greater magnitude. By doing so, the signal amplifying unit 130 can achieve a maximum coding efficiency at each point. A method of the bias generating unit 120 for applying a bias will be described later in detail with reference to FIG. 3. The signal amplified by the signal amplifying unit 130 is transmitted to a signal receiving apparatus, passing through a filter 140 and a transmitting unit 150.

Figure 2:
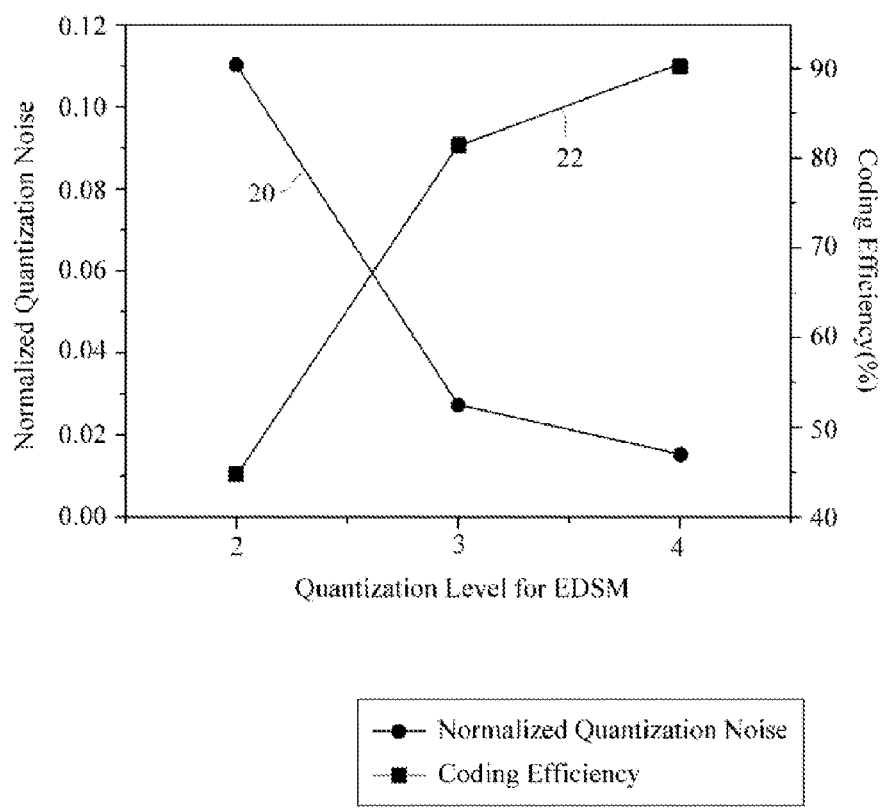
FIG. 2 is a graph showing a coding efficiency according to the number of levels in use of an ML-EDSM according to an exemplary embodiment of the present invention.

FIG. 2 is a graph showing a coding efficiency according to the number of levels in use of an ML-EDSM according to an exemplary embodiment of the present invention.

An x-axis of the graphs in FIG. 2 represents the number of quantization levels for EDSM, a y-axis denoted by reference numeral 20 represents normalized quantization noise, and a y-axis denoted by reference numeral 22 represents coding efficiency (%). Referring to FIGS. 1 and 2, in the case of use of a 2-level EDSM (an 1-bit quantizer), a coding efficiency 22 is about 48%, and an overall efficiency is about 30% even under assumption that an efficiency of the signal amplifying unit 130 is 60%. In contrast, in the case of 3-level or 4-level quantization, it is shown that a coding efficiency is above 80%. In addition, it is recognized that quantization noise 20 is drastically reduced when 3-level and 4-level quantization is performed, compared to 2-level quantization.

Figure 3:
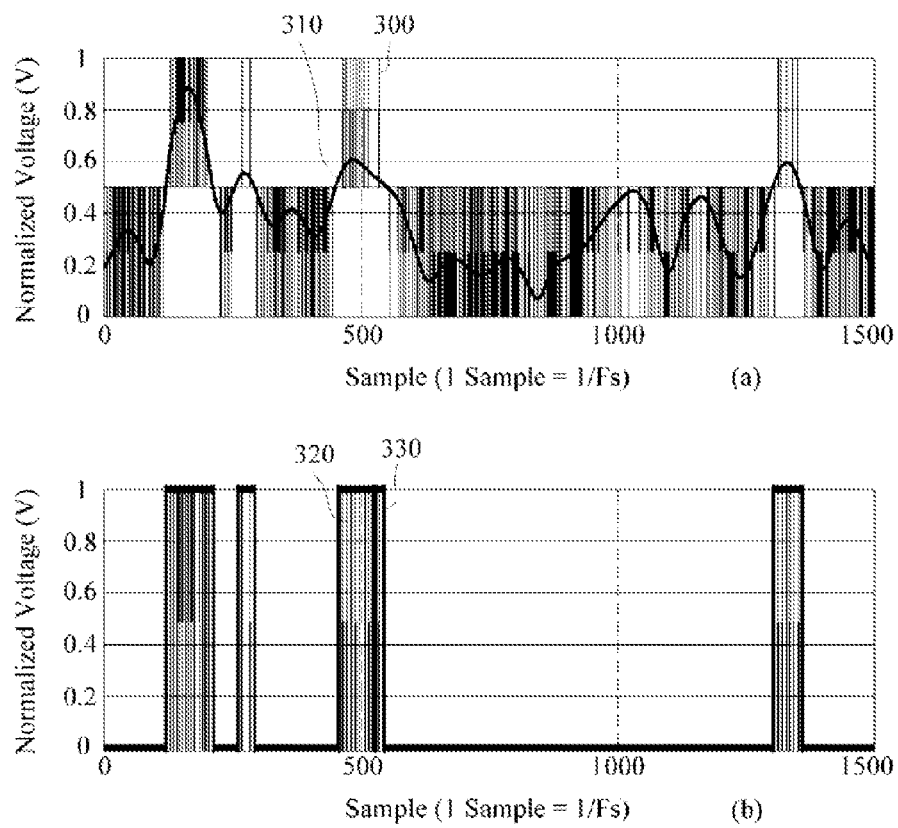
FIG. 3 is a graph showing output operation sequences of a bias generating unit in response to an input signal of a signal amplifying unit according to an exemplary embodiment of the present invention.

FIG. 3 is a graph showing output operation sequences of a bias generating unit in response to an input signal of a signal amplifying unit according to an exemplary embodiment of the present invention.

Referring to FIG. 1 and (a) in FIG. 3, an original envelope signal 310 is quantized into multiple levels, for example, 3 levels, thereby becoming a 3-level quantized envelope signal 300, and has a signal amplitude probability distribution of (1, 0.5, 0). It is appreciable that an envelope signal having a probability distribution of "1" has a far smaller probability distribution than an envelope signal having a probability distribution of "0.5." Since the signal amplifying unit 130 probabilistically operates at a signal amplitude of "0.5," a supply voltage smaller than a maximum bias value is required. Thus, as shown in FIG. 1, the signal amplifying unit 130 operates at an intermediate bias level for most time periods. However, in a case in which a pulse signal of large amplitude is suddenly applied to the signal amplifying unit 130, the bias generating unit 120 which is characterized in low frequency may not be able to keep pace with the application of the pulse signal.

Referring to (b) in FIG. 3, to solve such drawbacks, the bias generating unit 120 is configured to search for a position of maximum pulse 320 among a 3-level quantized envelope signal that is input to the signal amplifying unit 130, and to operate with respect to a low frequency signal by producing an ON pulse signal before the position of maximum pulse is reached. This operation is referred to as a window flag scheme. A control pulse that is output from the bias generating unit 120 according to the window flag scheme is a regenerated dual bias injection pulse signal as denoted by reference numeral 330 in (b) in FIG. 3.

Figure 4:
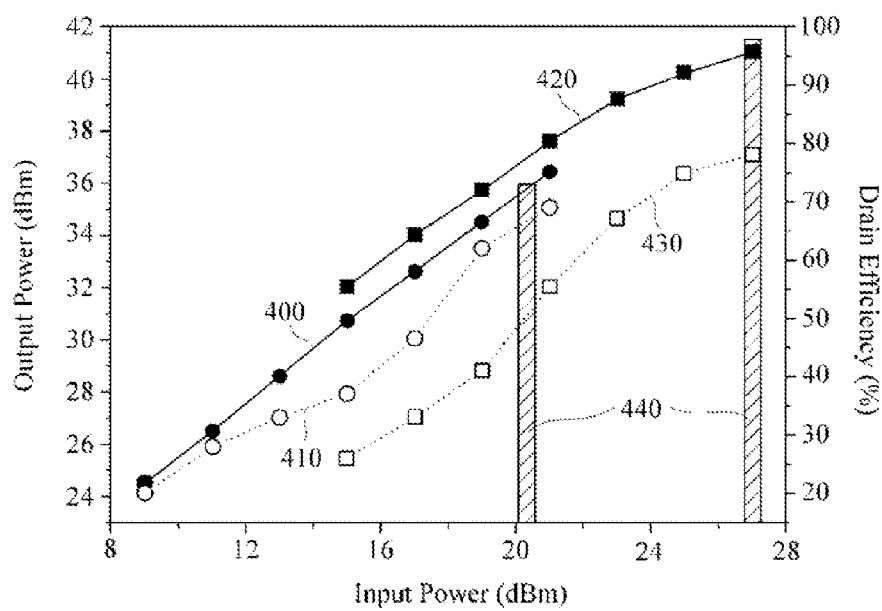
FIG. 4 is a graph showing a result of testing an output power and drain efficiency according to an input power in the case of use of an ML-EDSM according to an exemplary embodiment of the present invention.

FIG. 4 is a graph showing a result of testing an output power and drain efficiency according to an input power in the case of use of an ML-EDSM according to an exemplary embodiment of the present invention.

In FIG. 4, the example assumes that an ML-EDSM quantizes a signal into 3 levels. An x-axis represents an input power, y-axes denoted by reference numerals 400 and 420 represent output powers, and y-axes denoted by reference numerals 410 and 430 represent drain efficiencies.

In FIG. 4, the example assumes that bias voltages of 19 V (420 and 430) and 15 V (400 and 410) are used and the signal amplifying unit 130 operates at a maximum power 41 dBm. Thus, in the case of use of a 3-level ML-EDSM, the signal amplifying unit 130 operates only at an output power of 41 dBm and an output power of 35 dBm, and corresponding bias voltages are 19 V and 15 V, respectively. Reference numeral 440 denotes an operation level of the signal amplifying unit 130.

Figure 5:
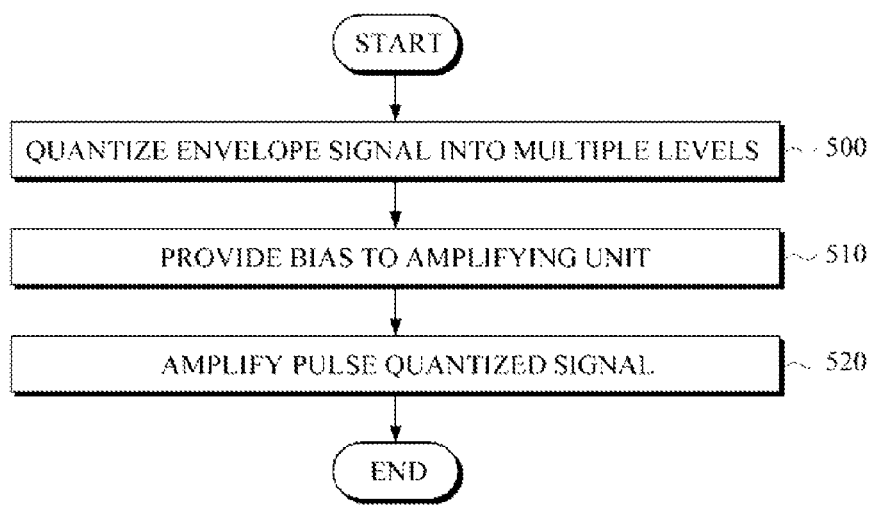
FIG. 5 is a flowchart illustrating an example of a method of amplifying a signal.

FIG. 5 is a flowchart illustrating an example of a method of amplifying a signal.

Referring to FIGS. 1 and 5, the signal modulating unit 100 of the signal amplifying apparatus 10 quantizes an envelope signal into multiple levels to output a multi-level quantized signal in operation 500. The envelope signal may be delta-sigma modulated. Then, the signal amplifying unit 130 amplifies a pulse quantized signal that is obtained by modulating the multi-level quantized signal into the form of a pulse in operation 520. To this end, the bias generating unit 120 tracks changes in amplitude of the pulse quantized signal, and provides a bias to the signal amplifying unit 130 based on a result of tracking in operation 510. The bias generating unit 120 may adjust a bias according to the amplitude of the pulse quantized signal and provides the signal amplifying unit 130 with the adjusted bias. In specific, the bias generating unit 120 tracks a position of maximum pulse among the pulse quantized signal, and provides the signal amplifying unit 130 with the bias around the position of maximum pulse.

In accordance with the above exemplary embodiments, a 3-level quantizer increases efficiency by approximately 20%, in comparison to a signal-bit quantizer, and has superior characteristics to competing devices, such as a Doherty power amplifier and an envelope tracker. As the level of the quantizer increases, the increase of efficiency becomes greater, and thus the signal amplifying apparatus according to the above exemplary embodiments may serve a new signal amplifier having a very high efficiency.

As apparent from the above, by quantizing an envelope signal into multiple levels, coding efficiency of an amplifier can be increased. Furthermore, changes in amplitude of a pulse quantized signal that is input to the amplifier are tracked, and a bias is provided to the amplifier based on a result of tracking, so that the efficiency of the amplifier can be improved.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A signal amplifying apparatus comprising:
   a signal modulating unit configured to quantize an envelope signal into multiple levels to output a multi-level quantized signal;
   a signal amplifying unit configured to amplify a pulse quantized signal that is obtained by transforming the multi-level quantized signal into a form of a pulse; and
   a bias generating unit configured to track changes in amplitude of the pulse quantized signal and to provide a bias to the signal amplifying unit based on a result of tracking,
   wherein the signal modulating unit quantizes the envelope signal into K levels, where K is at least three, and
   wherein the bias generating unit detects a position of maximum pulse among the pulse quantized signal, generates a pulse signal of the bias generating unit near the position of maximum pulse and provides the generated pulse signal to the signal amplifying unit.

2. The signal amplifying apparatus of claim 1, wherein the signal modulating unit delta-sigma modulates the envelope signal.

3. A wireless transmitting apparatus comprising:
   a polar coordinate transformation unit configured to transform an input signal into polar coordinates and output an envelope signal;
   a signal modulating unit configured to quantize the envelope signal into at least three levels to output a multi-level quantized signal;
   a signal amplifying unit configured to amplify a pulse quantized signal, which is obtained by transforming the multi-level quantized signal into a form of a pulse, and to output the amplified pulse quantized signal;
   a bias generating unit configured to track changes in amplitude of the pulse quantized signal and to provide a bias to the signal amplifying unit based on a result of tracking; and
   a transmitting unit configured to transmit the amplified pulse quantized signal output from the signal amplifying unit through an antenna,
   wherein the bias generating unit detects a position of maximum pulse among the pulse quantized signal, generates a pulse signal of the bias generating unit near the position of maximum pulse and provides the generated pulse signal to the signal amplifying unit.

4. The wireless transmitting apparatus of claim 3, wherein the bias generating unit adjusts a bias to be provided to the signal amplifying unit according to the amplitude of the pulse quantized signal.

5. A method of amplifying a signal in a signal amplifying apparatus, the method comprising:
   quantizing an envelope signal into K levels to output a multi-level quantized signal, where K is at least three;
   amplifying a pulse quantized signal that is obtained by transforming the multi-level quantized signal into a form of a pulse; and
   tracking changes in amplitude of the pulse quantized signal and providing a bias for amplifying the pulse quantized signal based on a result of tracking,
   wherein the providing of the bias for amplifying the pulse quantized signal comprises tracking a position of maximum pulse among the pulse quantized signal and providing the bias near the position of maximum pulse.

6. The method of claim 5, wherein the providing of the bias for amplifying the pulse quantized signal comprises adjusting a bias according to the amplitude of the pulse quantized signal.

7. The method of claim 5, wherein adjusting the bias includes selecting the bias from no more than K-1 bias voltages.

8. The method of claim 1, wherein the bias generating unit provides the bias selected from no more than K-1 bias voltages.

* * * * *